(12) United States Patent
Dark et al.

(10) Patent No.: US 7,507,607 B1
(45) Date of Patent: Mar. 24, 2009

(54) METHOD OF FORMING A SILICIDE BRIDGED ANTI-FUSE WITH A TUNGSTEN PLUG METALIZATION PROCESS

(75) Inventors: Charles A. Dark, Arlington, TX (US); William M. Coppock, Arlington, TX (US); Jeffery L. Nilles, Los Altos, CA (US); Andy Strachan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1024 days.

(21) Appl. No.: 10/880,284

(22) Filed: Jun. 29, 2004

Related U.S. Application Data

(62) Division of application No. 10/042,811, filed on Jan. 8, 2002, now Pat. No. 6,815,797.

(51) Int. Cl.
*H01L 21/82* (2006.01)
*H01L 29/04* (2006.01)

(52) U.S. Cl. .................. 438/131; 438/600; 438/467; 438/257; 257/50; 257/344; 257/209; 257/503

(58) Field of Classification Search .......... 438/131, 438/600, 467, 957; 257/50, 344, 209, 530
See application file for complete search history.

(56) References Cited

U.S. PATENT DOCUMENTS

| | | | |
|---|---|---|---|
| 4,651,409 A * | 3/1987 | Ellsworth et al. | 438/207 |
| 5,508,220 A * | 4/1996 | Eltoukhy et al. | 438/600 |
| 5,525,822 A | 6/1996 | Vinal | 257/344 |
| 5,915,179 A | 6/1999 | Etou et al. | 438/268 |
| 6,404,026 B2 | 6/2002 | Tsuyuki | 257/409 |
| 6,563,189 B1 | 5/2003 | Dark et al. | 257/530 |
| 6,815,797 B1 * | 11/2004 | Dark et al. | 257/530 |

OTHER PUBLICATIONS

Donald T. Comer, "Zener Zap Anti-Fuse Trim in VLSI Circuits", VLSI Design, 1996, vol. 5, No. 1, pp. 89-100.
P. Beaud et al., "0.5um Technology Development and Qualification"[online], [retrieved on Dec. 14, 2003]. Retrieved from the Internet: URL:http://legwww.epfl.ch/research/pdf/05umf.pdf>. pp. 1-2 (Unnumbered).

* cited by examiner

*Primary Examiner*—Kenneth A Parker
*Assistant Examiner*—Joseph Nguyen
(74) *Attorney, Agent, or Firm*—Mark C. Pickering

(57) ABSTRACT

A silicide bridged anti-fuse and a method of forming the anti-fuse are disclosed. The silicide bridged anti-fuse can be formed with a tungsten plug metalization process that does not require any additional process steps. As a result, anti-fuses can be added to an electrical circuit as trim elements for no additional cost.

20 Claims, 8 Drawing Sheets

METHOD OF FORMING A SILICIDE BRIDGED ANTI-FUSE WITH A TUNGSTEN PLUG METALIZATION PROCESS

This is a divisional application of application Ser. No. 10/042,811 filed on Jan. 8, 2002, now U.S. Pat. No. 6,815,797, issued on Nov. 9, 2004.

BACKGROUND OF THE INVENTION

1. Field of the Invention

The present invention relates to anti-fuses and, more particularly, to a silicide bridged anti-fuse and a method of forming the anti-fuse with a tungsten plug metalization process.

2. Description of the Related Art

Trim elements are devices that are used in analog circuits to provide an electrically programmable method of adjusting certain device parameters. For example, trim elements are often used to trim resistor values in critical circuits. See Corner, "Zener Zap Anti-Fuse Trim in VLSI Circuits," VLSI Design, 1996, Vol. 15, No. 1, p. 89.

One type of trim element is an anti-fuse. Unlike a fuse which, when programmed, changes from a low-resistance to a high-resistance device to block a current from flowing through the device, an anti-fuse is a device which, when programmed, changes from a high-resistance to a low-resistance device to allow a current to flow through the device.

FIG. 1 shows a cross-sectional view that illustrates a prior-art anti-fuse 100. As shown in FIG. 1, anti-fuse 100, which is formed in a n-type semiconductor material 110, includes a p-well 112 that is formed in material 110, and a n+ region 114 that is formed in p-well 112. In addition, a metal interconnect 116 is formed on p-well 112 to make an electrical connection with p-well 112, while a metal interconnect 118 is formed on n+ region 114 to make an electrical connection with n+ region 114.

In operation, a first voltage is applied to p-well 112 via metal interconnect 116, and a second higher voltage is applied to n+ region 114 via metal interconnect 118. In this situation, the junction between p-well 112 and n+ region 114 is reverse biased, thereby allowing no current to flow from metal interconnect 116 to metal interconnect 118.

To program anti-fuse 100, the reverse biased voltage is increased until avalanche breakdown occurs at the p-n junction. The reverse biased voltage can be increased by, for example, increasing the voltage on n+ region 114. When avalanche breakdown occurs, a breakdown current flows near the surface from metal interconnect 116 to metal interconnect 118.

The current flow causes localized heating which, in turn, causes metal atoms from metal interconnect 118 to migrate to metal interconnect 116 along the path of the breakdown current. The metal atom migration results in a trace of metal being formed along the path of the breakdown current. The trace of metal provides a low-resistance path between metal interconnect 116 and metal interconnect 118. (Prior art anti-fuses can also be programmed with forward-biased voltages that generate the necessary current flow.)

Although anti-fuse 100 performs satisfactorily, there is a need for alternate structures and methods of forming an anti-fuse.

SUMMARY OF THE INVENTION

The present invention provides a silicide bridged anti-fuse and a method of forming the anti-fuse. The silicide bridged anti-fuse can be fabricated in a tungsten plug metalization process that does not require any additional process steps to form the anti-fuse. As a result, anti-fuse trim elements can be added to an electrical circuit for no additional cost.

An anti-fuse in accordance with the present invention includes a well that is formed in a first semiconductor material. The first semiconductor material has a first conductivity type, while the well has a surface and a second conductivity type. The anti-fuse also includes a first doped region of the second conductivity type that is formed in the well, a second doped region of the first conductivity type that is formed in the well, and a third doped region of the second conductivity type that is formed in the well. The first and third doped regions have dopant concentrations that are greater than the dopant concentration of the well. The second doped region is spaced apart from the first doped region, and the third doped region is spaced apart from the first and second doped regions.

The anti-fuse further includes a layer of insulation material that is formed on the surface of the well. The layer of insulation material has a first opening that exposes the first doped region of the well, and a second opening that exposes the second doped region of the well. In addition, the layer of insulation material has a third opening that exposes the third doped region of the well.

In addition, the anti-fuse includes a first section of a second semiconductor material that is formed on the layer of insulation material and the first region, and a second section of the second semiconductor material that is formed on the layer of insulation material and the second region. The second section is spaced apart from the first section. Further, a first layer of dielectric material is formed on the first section, the second section, and the third doped region.

The present invention provides a method of forming an anti-fuse on a first semiconductor material of a first conductivity type. The method includes the steps of forming a well in the first semiconductor material, and forming a layer of insulation material on the surface of the well. The method also includes the step of removing a first portion of the layer of insulation material to expose a first region on the surface of the well, and a second portion of the layer of insulation material to expose a second region on the surface of the well.

In addition, the method includes the steps of forming a layer of second semiconductor material on the layer of insulation material, the first region, and the second region, and etching the layer of second semiconductor material to form a first section and a second section. Further, the method includes the step of removing the layer of insulation material between the first and second sections to expose a third region on the surface of the well.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
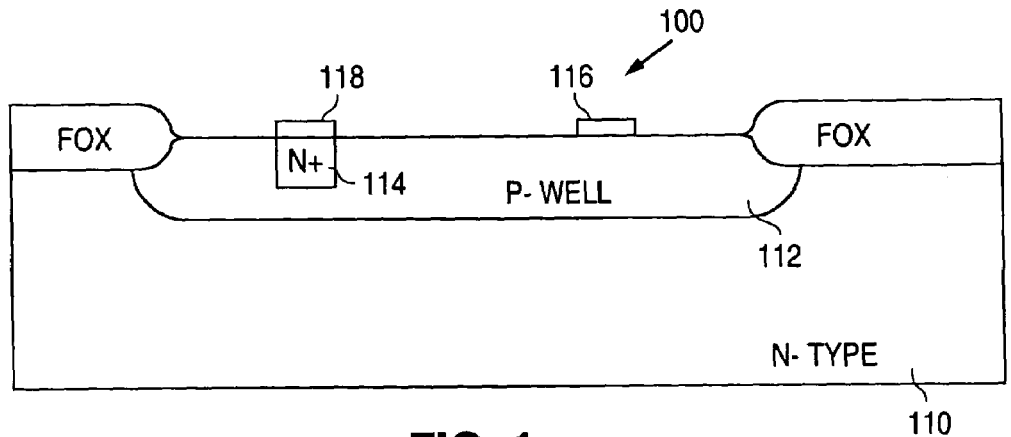
FIG. 1 is a cross-sectional diagram illustrating a prior-art anti-fuse 100.
Figure 2:
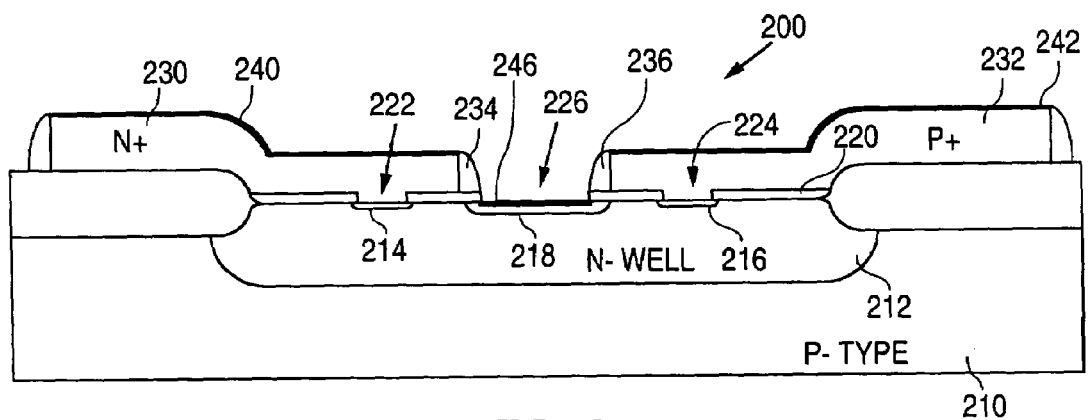
FIG. 2 is a cross-sectional view illustrating an anti-fuse 200 in accordance with the present invention.

FIG. 2 shows a cross-sectional view that illustrates an anti-fuse 200 in accordance with the present invention. As described in greater detail below, anti-fuse 200 is formed as a silicide bridged anti-fuse in a tungsten plug metalization process that does not require any additional process steps to form the anti-fuse.

As shown in FIG. 2, anti-fuse 200, which is formed in a p-type semiconductor material 210, includes a n-well 212 that is formed in material 210, and a n+ region 214 that is positioned in n-well 212. (The well can be either n-type or p-type.) In addition, anti-fuse 200 also includes a p+ region 216 that is positioned in n-well 212, and a n+ region 218 that is positioned in n-well 212.

As further shown in FIG. 2, anti-fuse 200 includes a layer of insulation material 220 that is formed on n-well 212. Insulation layer 220, in turn, has a first opening 222 that exposes n+ region 214, a second opening 224 that exposes p+ region 216, and a third opening 226 that exposes n+ region 218.

Further, anti-fuse 200 includes an n+ polysilicon section 230 that is formed on insulation layer 220 and n+ region 214, and a p+ polysilicon section 232 that is formed on the insulation layer 220 and p+ region 216. In addition, a side wall spacer 234 is formed to adjoin polysilicon section 230 over n+ region 218, and a side wall spacer 236 is formed to adjoin polysilicon section 232 over n+ region 218.

Anti-fuse 200 also includes a first layer of silicide 240 that is formed on polysilicon section 230, a second layer of silicide 242 that is formed on polysilicon section 232, and a third layer of silicide 246 that is formed on n+ region 218. Silicide layer 246 is electrically isolated from silicide layer 240 by spacer 234, and from silicide layer 242 by spacer 236.

In operation, a first voltage is applied to p+ region 216 via polysilicon section 232 and silicide layer 242, and a second higher voltage is applied to n-well 212 via n+ region 214, polysilicon section 230, and silicide layer 240. In this situation, the junction between n-well 212 and p+ region 216 is reverse biased, thereby allowing no current to flow from polysilicon section 232 to polysilicon section 230.

To program anti-fuse 200, the reverse biased voltage is increased until avalanche breakdown occurs at the p-n junction. The reverse biased voltage can be increased by, for example, increasing the voltage on silicide layer 240. When avalanche breakdown occurs, a breakdown current flows from silicide layer 242 through polysilicon section 232 to p+ region 216, and then, near the surface from p+ region 216 to n+ region 218 to n+ region 214.

From n+ region 214, the breakdown current flows through polysilicon layer 230 to silicide layer 240. The current flow causes localized heating which, in turn, causes metal atoms from silicide layer 240 to migrate to silicide layer 242 along the path of the breakdown current.

Figure 3:
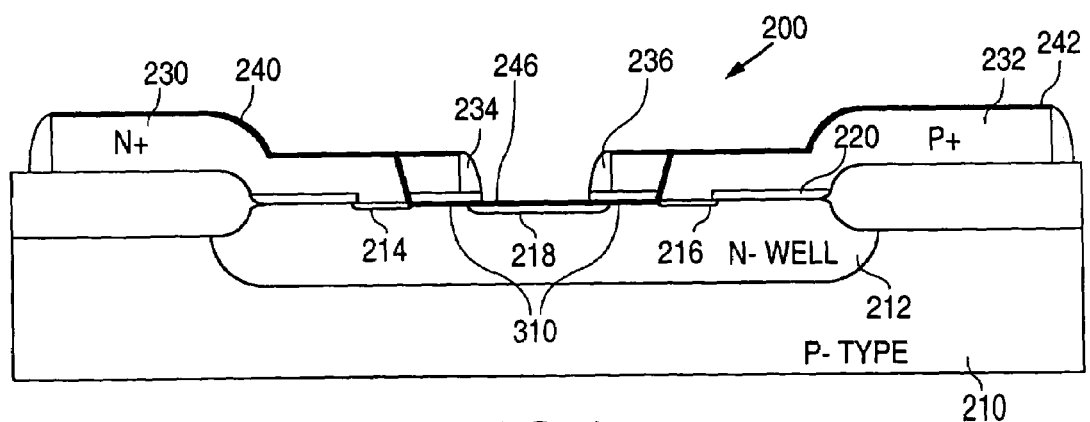
FIG. 3 is a cross-sectional view illustrating the operation of anti-fuse 200 in accordance with the present invention.

FIG. 3 shows a cross-sectional view that illustrates the operation of anti-fuse 200 in accordance with the present invention. As shown in FIG. 3, the metal atom migration results in a metal trace 310 being formed along the path of the breakdown current. Metal trace 310 provides a low resistance path between silicide layer 242 and silicide layer 240. This low resistance path means that a large current will flow when the anti-fuse is biased according to the operation voltages.

One of the advantages of the present invention is that the present invention can be incorporated into a tungsten plug metalization process that does not require any additional process steps to form the anti-fuse. As a result, anti-fuse trim elements can be added to an electrical circuit for no additional cost.

Figure 4A:
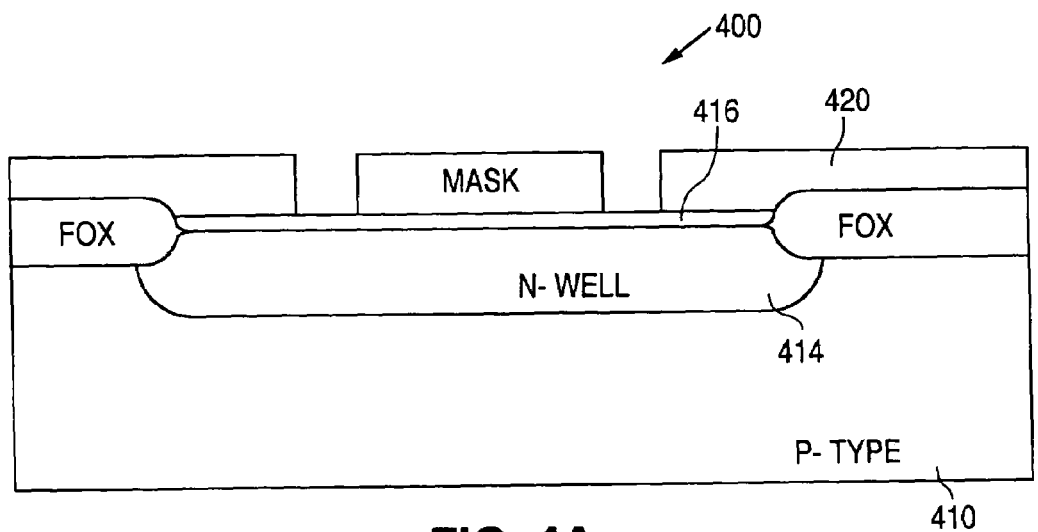
FIGS. 4A-4R are cross-sectional views illustrating a method 400 of forming an anti-fuse in accordance with the present invention.
Figure 4B:
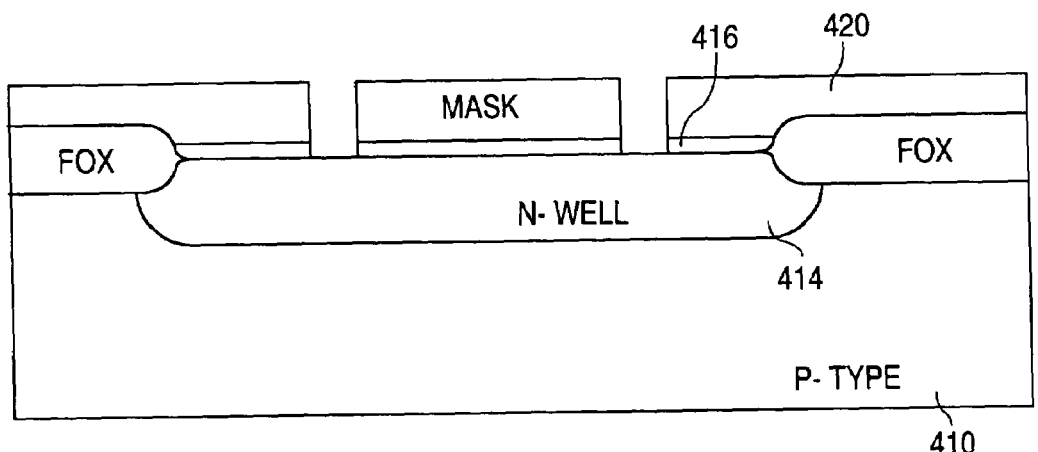
Figure 4C:
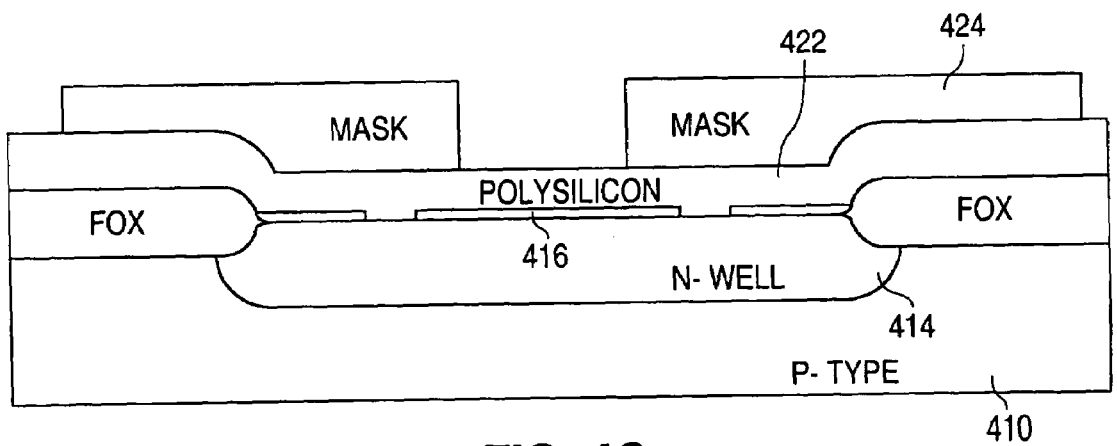
Figure 4D:
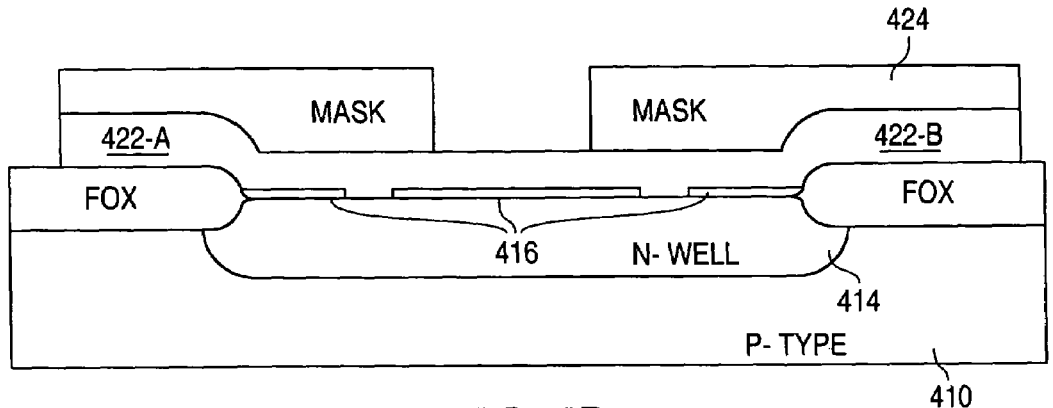
Figure 4E:
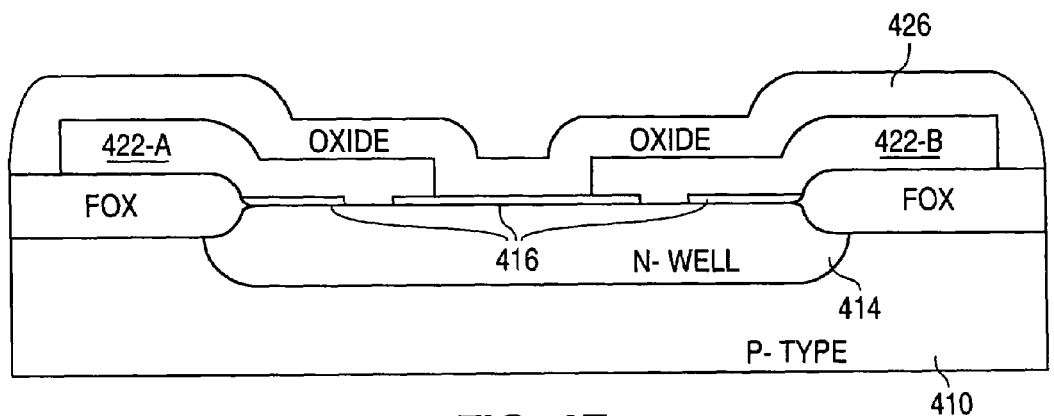
Figure 4F:
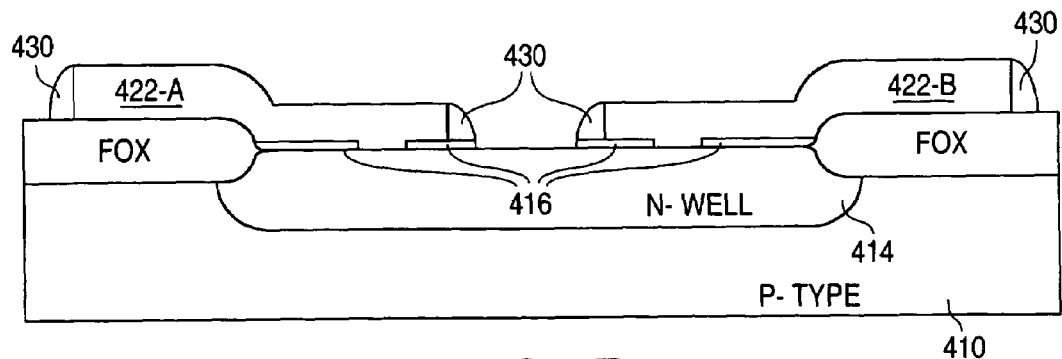
Figure 4G:
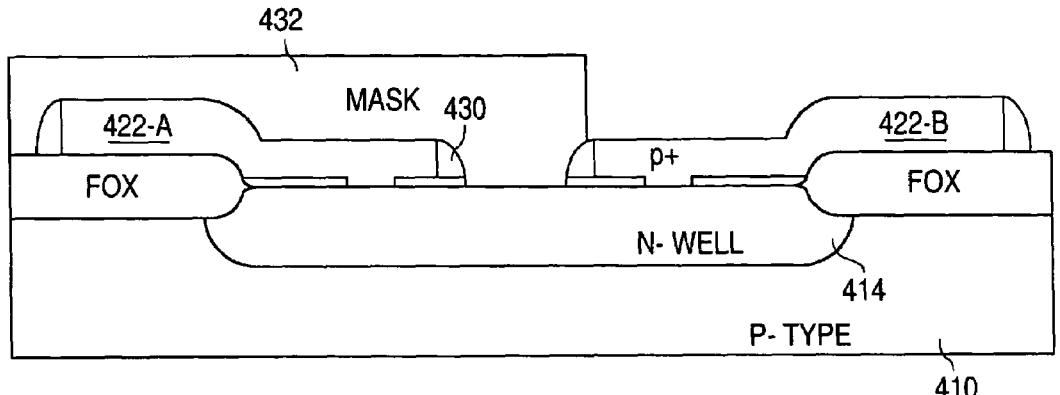
Figure 4H:
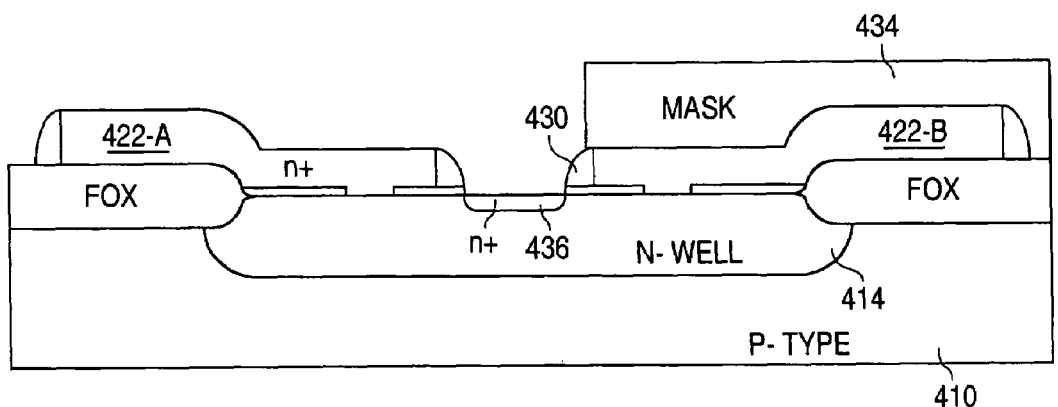
Figure 4I:
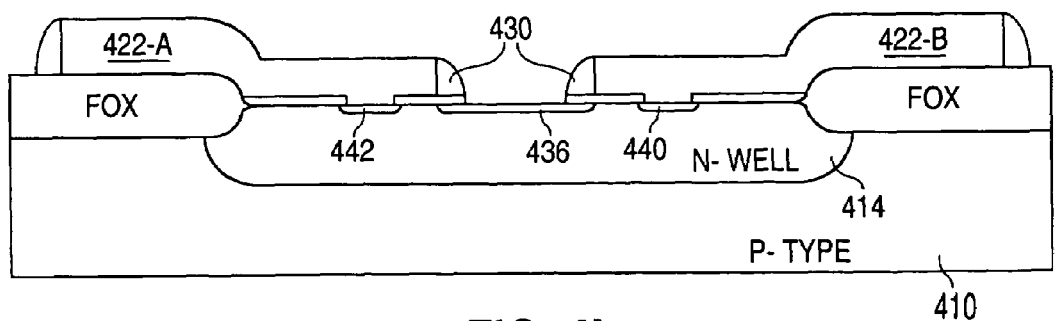
Figure 4J:
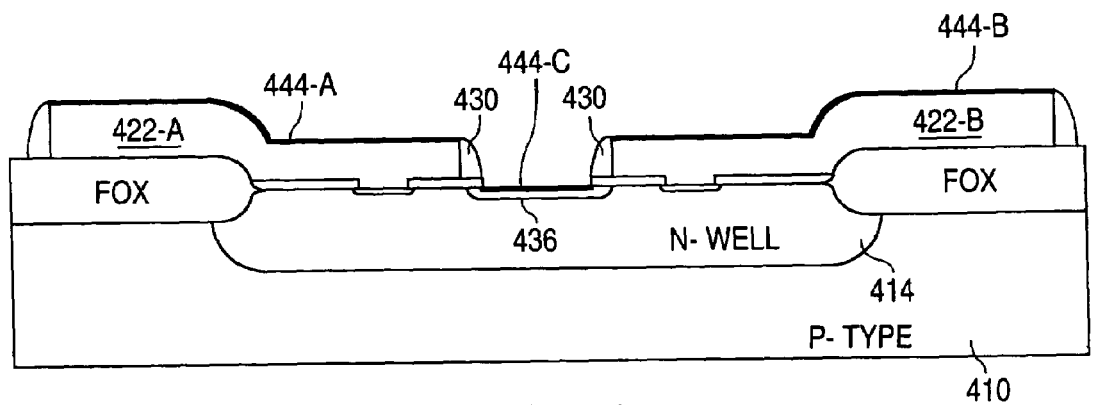
Figure 4K:
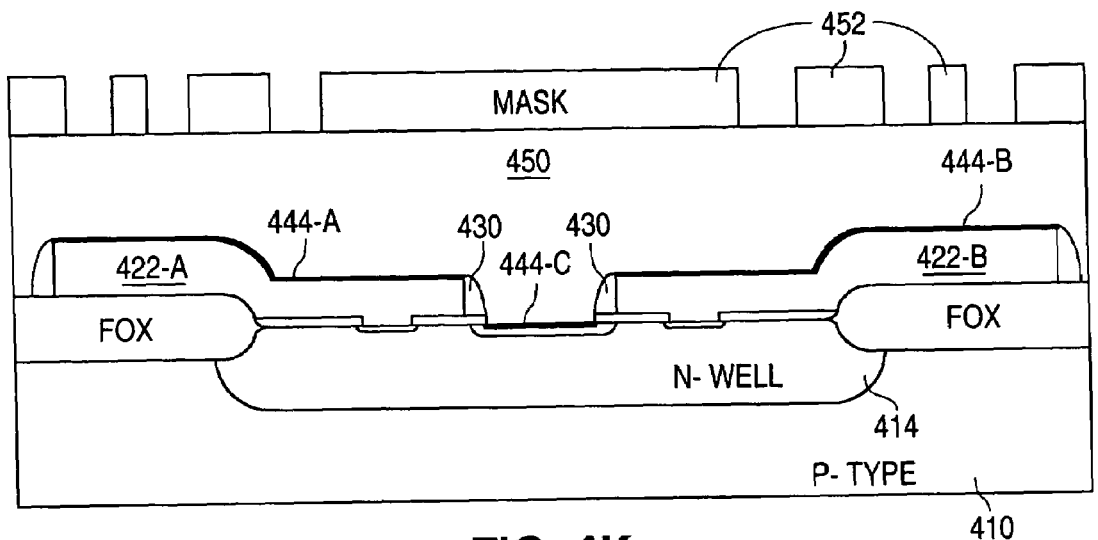
Figure 4L:
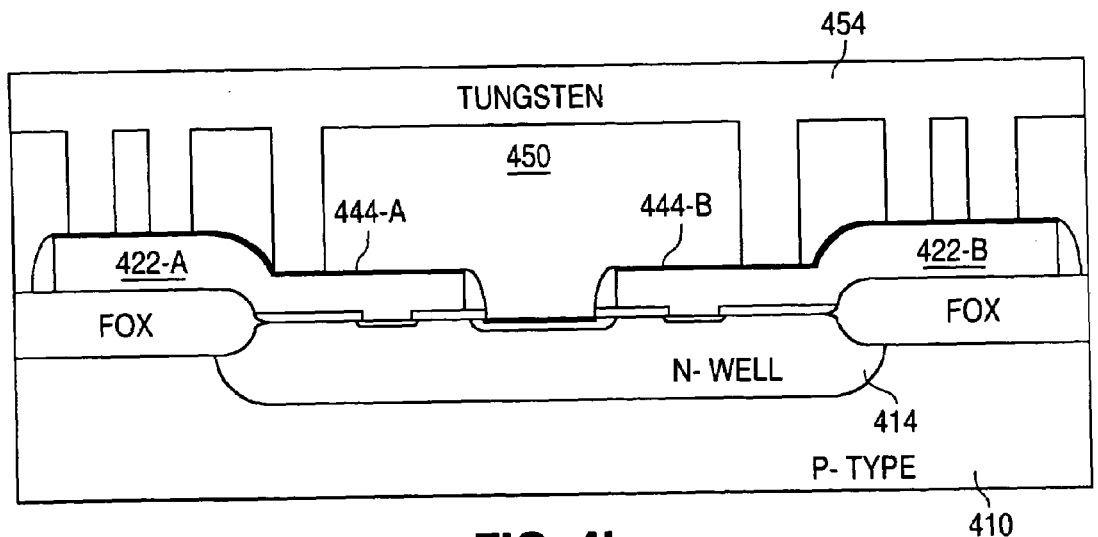
Figure 4M:
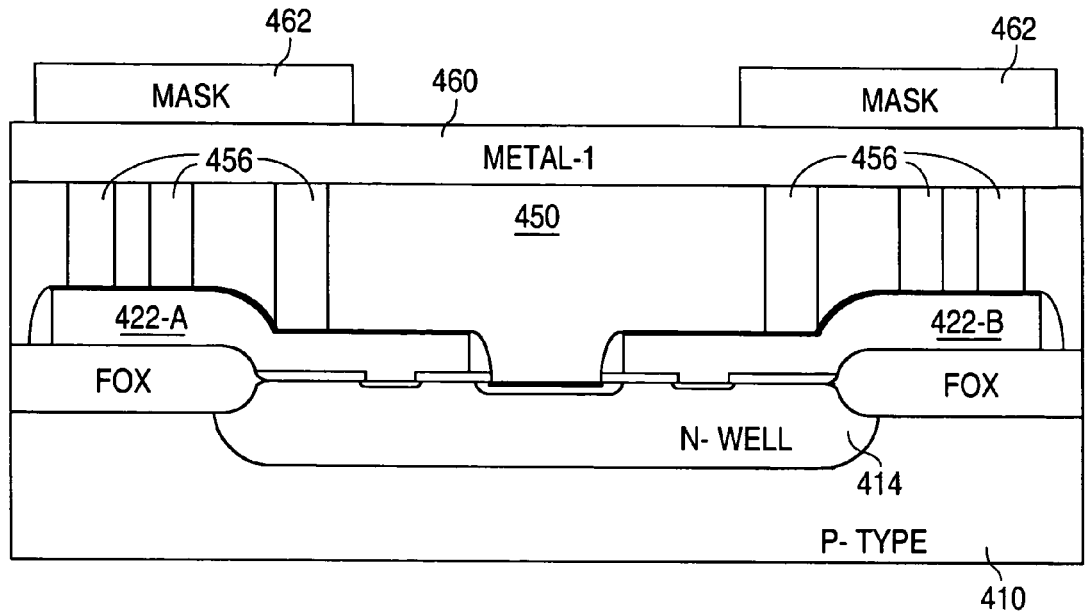
Figure 4N:
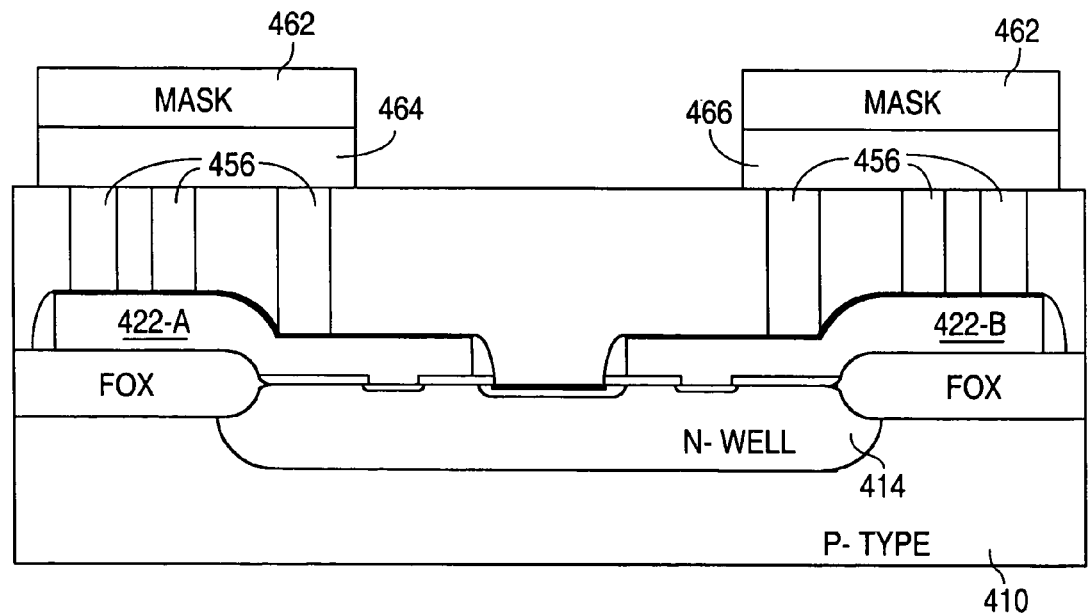
Figure 4O:
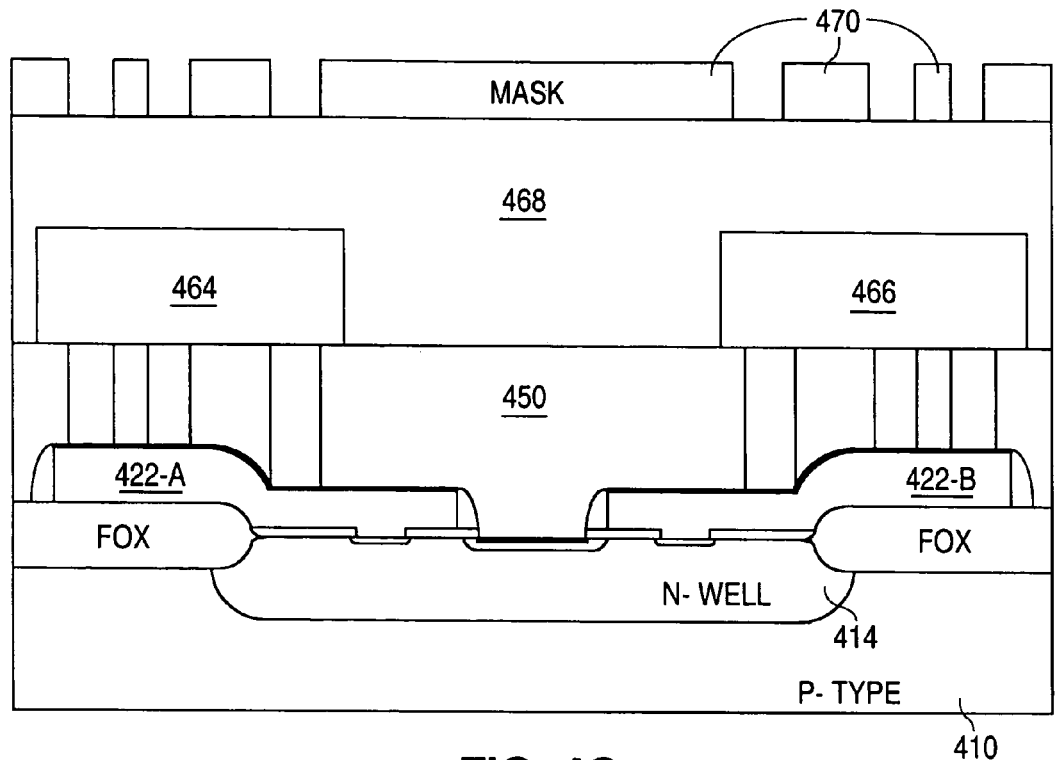
Figure 4P:
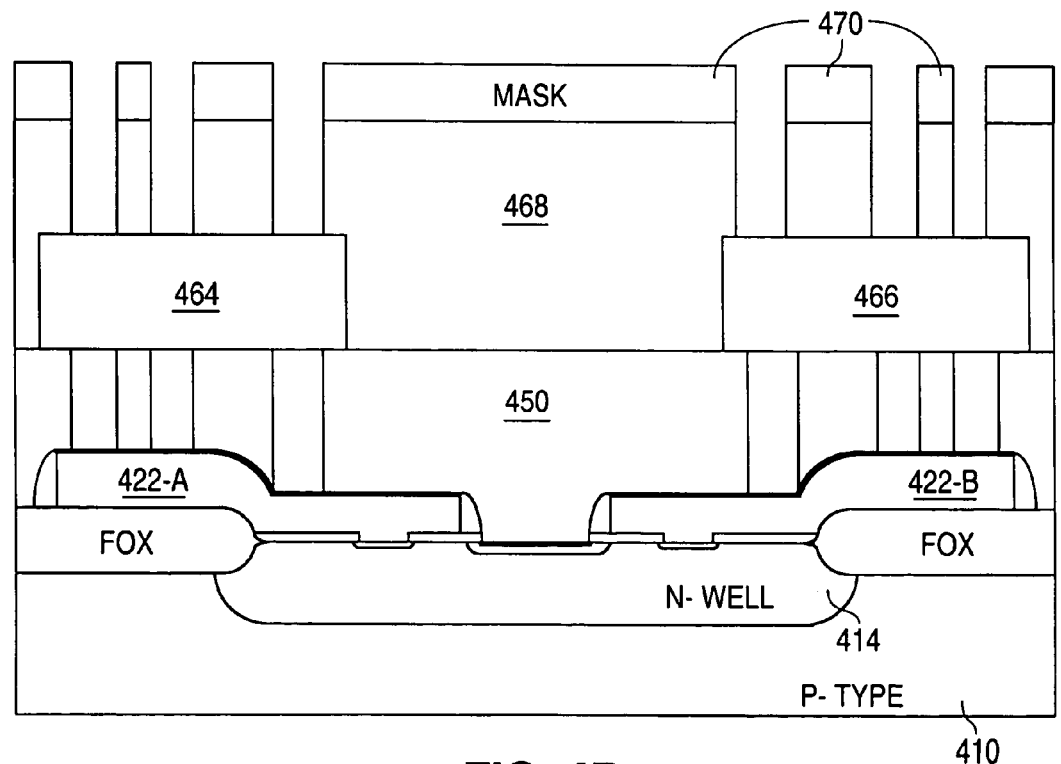
Figure 4Q:
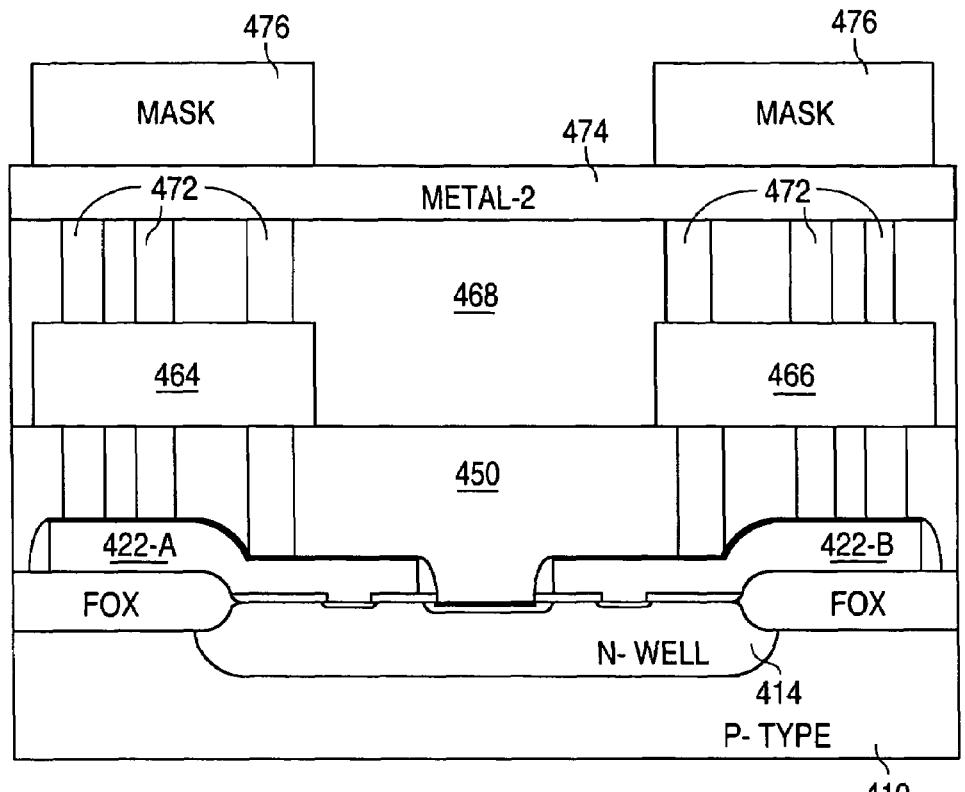
Figure 4R:
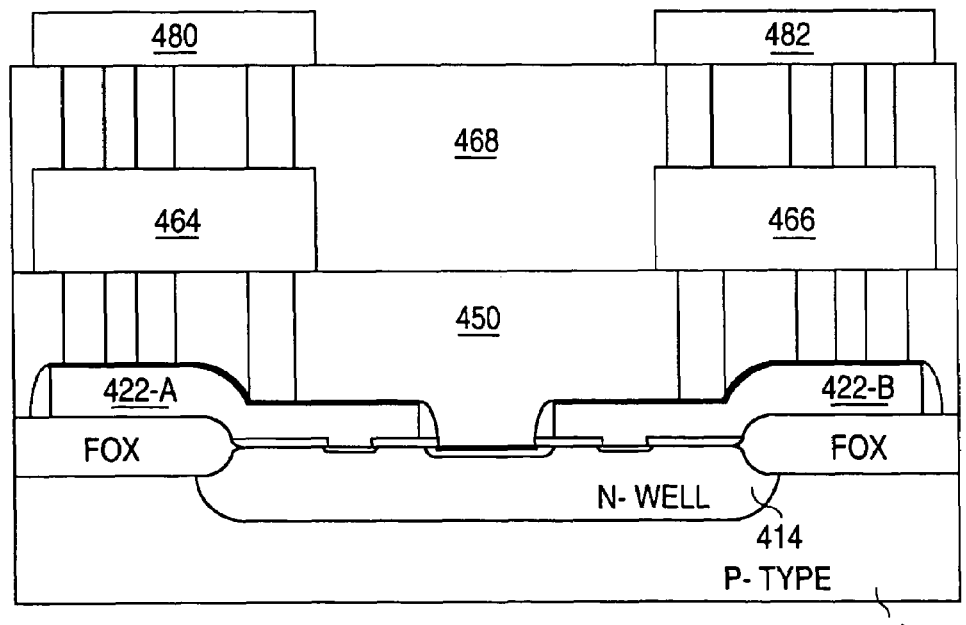

FIGS. 4A-4R show cross-sectional views that illustrate a method 400 of forming an anti-fuse in accordance with the present invention. As shown in FIG. 4A, method 400 utilizes a conventionally formed wafer that has a p-type substrate 410, and a field oxide layer FOX that is formed on substrate 410. The field oxide layer FOX has a pattern that exposes a region on the surface of substrate 410.

As further shown in FIG. 4A, method 400 begins by implanting substrate 410 with an n-type dopant to form an n-well 414 in substrate 410. (The well can be formed to be either n-type or p-type.) Following the implant, the wafer is annealed. The annealing step drives in the n-type dopant, and repairs lattice damage caused by the implantation. After annealing the wafer, a layer of oxide 416 is formed on the surface of n-well 414. Next, a mask 420 is formed and patterned on oxide layer 416.

Referring to FIG. 4B, once mask 420 has been formed, the exposed regions of oxide layer 416 are etched until the underlying surface of n-well 414 is exposed. Mask 420 is then removed. Referring to FIG. 4C, after mask 420 has been removed, a layer of polysilicon 422 is formed on the surface of n-well 414, oxide layer 416, and field oxide layer FOX. Following this, a mask 424 is formed and patterned on polysilicon layer 422.

Referring to FIG. 4D, once mask 424 has been patterned, the exposed regions of polysilicon layer 422 are etched until the polysilicon is removed and the underlying surface of oxide layer 416 is exposed. As shown, the etch forms a polysilicon section 422-A, and a spaced-apart polysilicon section 422-B. After the etch, mask 424 is removed.

Referring to FIG. 4E, once mask 424 has been removed, a layer of oxide 426 is formed on the surface of oxide layer 416, polysilicon section 422-A, and polysilicon section 422-B. Referring to FIG. 4F, once oxide layer 426 has been formed, oxide layer 426 is anisotropically etched to form side wall spacers 430.

The anisotropic etch also removes a substantial amount of the exposed portion of oxide layer 416. (Oxide layer 426 is significantly thicker than oxide layer 416.) Following the anisotropic etch, the wafer is cleaned. Together, the anisotropic etch and the cleaning step remove the exposed portion of oxide layer 416, thereby exposing a region on the surface of n-well 414.

Referring to FIG. 4G, a mask 432 is next formed and patterned on the surface of n-well 414, polysilicon section 422-A, and side wall spacers 430. After this, the exposed regions of polysilicon section 422-B are implanted with a p-type dopant to have a p+ dopant concentration. Mask 432 is then removed.

Referring to FIG. 4H, after mask 432 has been removed, a mask 434 is formed and patterned on polysilicon section 422-B and side wall spacers 430. After this, the exposed regions of polysilicon section 422-A and the surface of n-well 414 are implanted with an n-type dopant to have a n+ dopant concentration. The implantation step forms an implanted region 436 in the surface of n-well 414. Mask 434 is then removed. (Although masks 432 and 434 are shown as lined up with spacer 430 to form region 436 as an n+ region, this is not required. Masks 432 and 434 can be positioned so that region 436 between spacers 430 is implanted with both n-type and p-type dopants.)

Referring to FIG. 4I, following the removal of mask 434, the wafer is annealed in a rapid thermal processing (RTP) step that activates the dopants. The RTP step causes the p+ dopant in polysilicon section 422-B to out diffuse into n-well 414 and form a p+ doped region 440. The RTP step also causes the n+ dopant in polysilicon section 422-A to out diffuse into n-well 414 and form an n+ doped region 442. The RTP step also causes implanted region 436 to diffuse out, extending laterally well under the side wall spacers 430.

Referring to FIG. 4J, after the RTP step, a layer of cobalt is deposited on polysilicon section 422-A, polysilicon section 422-B, the side wall spacers 430, and the surface of implanted region 436. The cobalt layer is then reacted to form a layer of cobalt silicide 444-A on polysilicon section 422-A, a layer of cobalt silicide 444-B on polysilicon section 422-B, and a layer of cobalt silicide 444-C on the surface of implanted region 436. Cobalt does not react with the oxide of spacers 430. Following this, the unreacted cobalt is removed.

Referring to FIG. 4K, after the unreacted cobalt has been removed, a layer of dielectric material 450 is formed on silicide layers 444-A, 444-B, and 444-C, and side wall spacers 430. Following this, a mask 452 is formed and patterned on dielectric layer 450.

Referring to FIG. 4L, once mask 452 has been patterned, the exposed regions of dielectric layer 450 are etched until the dielectric is removed and the underlying surfaces of cobalt silicide layer 444-A and 444-B are exposed. After the etch, mask 452 is removed. Next, a layer of tungsten 454 is formed on dielectric layer 450 to make electrical connections with the underlying surfaces of cobalt silicide layer 444-A and 444-B.

Referring to FIG. 4M, after tungsten layer 454 has been formed, tungsten layer 454 is anisotropically etched to remove tungsten layer from the top surface of dielectric layer 450. As shown, the etch forms a number of tungsten contacts 456. Following this, a first layer of metal (metal-1) 460 is formed on dielectric layer 450 and contacts 456. Metal-1 layer 460 can be implemented with, for example, an aluminum alloy. Following this, a mask 462 is formed and patterned on metal-1 layer 460.

Referring to FIG. 4N, once mask 462 has been patterned, the exposed regions of metal-1 layer 460 are etched until the metal is removed and the underlying surfaces of dielectric layer 450 are exposed. As shown, the etch forms a first metal trace 464 and a second metal trace 466. After the etch, mask 462 is removed.

Referring to FIG. 4O, after mask 462 has been removed, a layer of dielectric material 468 is formed on dielectric layer 450 and traces 464 and 466. Following this, a mask 470 is formed and patterned on dielectric layer 468.

Referring to FIG. 4P, once mask 470 has been patterned, the exposed regions of dielectric layer 468 are etched until the dielectric is removed and the underlying surfaces of traces 464 and 466 are exposed. After the etch, mask 470 is removed.

Referring to FIG. 4Q, a layer of tungsten is next formed on dielectric layer 468 to make electrical connections with the underlying surfaces of traces 464 and 466. Next, the tungsten layer is anisotropically etched to remove the tungsten layer from the top surface of dielectric layer 468. As shown, the etch forms a number of tungsten vias 472. Following this, a second layer of metal (metal-2) 474 is formed on dielectric layer 468 and vias 472. Metal-2 layer 474 can be implemented with, for example, an aluminum alloy. Following this, a mask 476 is formed and patterned on metal-2 layer 474.

Referring to FIG. 4R, once mask 476 has been patterned, the exposed regions of metal-2 layer 474 are etched until the metal is removed and the underlying surfaces of dielectric layer 468 are exposed. As shown, the etch forms a first metal trace 480 and a second metal trace 482. After the etch, mask 476 is removed.

Thus, a silicide bridged anti-fuse, and a method of forming the anti-fuse, have been described. As noted above, one of the advantages of the present invention is that a silicide bridged anti-fuse can be formed in a tungsten plug metalization process that does not require any additional process steps to form the anti-fuse. As a result, anti-fuse trim elements can be added to an electrical circuit for free.

It should be understood that various alternatives to the method of the invention described herein may be employed in practicing the invention. Thus, it is intended that the following claims define the scope of the invention and that methods and structures within the scope of these claims and their equivalents be covered thereby.

What is claimed is:

1. A method of forming an anti-fuse on a first semiconductor material of a first conductivity type, the method comprising:
    forming a well in the first semiconductor material, the well having a surface and a second conductivity type;
    forming a layer of insulation material on the surface of the well;
    removing a first portion of the layer of insulation material to expose a first region on the surface of the well, and a second portion of the layer of insulation material to expose a second region on the surface of the well;
    forming a layer of second semiconductor material on the layer of insulation material, the first region, and the second region;
    etching the layer of second semiconductor material to form a first section and a second section; and
    removing the layer of insulation material between the first and second sections to expose a third region on the surface of the well.

2. The method of claim 1 and further comprising of doping the third region with a dopant to form a doped region in the well.

3. The method of claim 1 and further comprising doping the first section and the third region with a dopant of the second conductivity type to dope the first section and form a doped region in the well, the doped region having a dopant concentration greater than a dopant concentration of the well.

4. The method of claim 3 and further comprising doping the second section with a dopant of the first conductivity type to dope the second section.

5. The method of claim 4 and further comprising forming a first layer of silicide on the first section, a second layer of silicide on the second section, and a third layer of silicide on the doped region.

6. The method of claim 5 and further comprising:
    forming a first layer of dielectric material on the first layer of silicide, the second layer of silicide, and the third layer of silicide, the first layer of dielectric material having a top surface; and
    forming first contacts through the first layer of dielectric material to make electrical connections with the first layer of silicide, and second contacts through the first layer of dielectric material to make electrical connections with the second layer of silicide.

7. The method of claim 6 wherein the step of forming first and second contacts includes:
    forming first openings in the first layer of dielectric material to expose regions of the first layer of silicide, and second openings in the first layer of dielectric material to expose regions of the second layer of silicide;
    depositing a layer of tungsten on the first layer of dielectric material to fill up the first openings and the second openings; and
    removing the layer of tungsten from the top surface of the first layer of dielectric material.

8. The method of claim 6 and further comprising forming a first metal trace on the first layer of dielectric material to make electrical connections with the first contacts, and a second metal trace on the first layer of dielectric material to make electrical connections with the second contacts.

9. The method of claim 1 and further comprising forming a first layer of silicide on the first section, a second layer of silicide on the second section, and a third layer of silicide on the third region.

10. The method of claim 9 and further comprising:
forming a first layer of dielectric material on the first layer of silicide, the second layer of silicide, and the third layer of silicide, the first layer of dielectric material having a top surface; and
forming first contacts through the first layer of dielectric material to make an electrical connection with the first layer of silicide, and second contacts through the first layer of dielectric material to make an electrical connection with the second layer of silicide.

11. The method of claim 10 and further comprising forming a first metal trace on the first layer of dielectric material to make electrical connections with the first contacts, and a second metal trace on the first layer of dielectric material to make electrical connections with the second contacts.

12. The method of claim 3 and further comprising forming a side wall spacer that adjoins the first section over the third region, and a side wall spacer that adjoins the second section over the third region.

13. The method of claim 9 and further comprising forming a side wall spacer that adjoins the first section over the third region, and a side wall spacer that adjoins the second section over the third region.

14. The method of claim 1 and further comprising:
forming a first layer of dielectric material over the first section and the second section, and on the third region; and
forming first contacts through the first layer of dielectric material to be electrically connected with the first section, and second contacts through the first layer of dielectric material to be electrically connected with the second section.

15. The method of claim 14 wherein the first and second contacts include tungsten and are free of aluminum.

16. A method of forming an anti-fuse on a first semiconductor material of a first conductivity type, the method comprising:
forming a well in the first semiconductor material, the well having a surface and a second conductivity type;
forming a layer of insulation material on the surface of the well;
removing a first portion of the layer of insulation material to expose a first region on the surface of the well, and a second portion of the layer of insulation material to expose a second region on the surface of the well, the first region and the second region being spaced apart regions of a same well;
forming a layer of second semiconductor material on the layer of insulation material, the first region, and the second region; and
etching the layer of second semiconductor material to form a first section of second semiconductor material and a second section of second semiconductor material, the first section of second semiconductor material touching the first region, the second section of second semiconductor material touching the second region and being spaced apart from the first section of second semiconductor material.

17. The method of claim 16 and further comprising:
forming a first non-conductive side wall spacer to touch a side wall of the first section of second semiconductor material; and
forming a second non-conductive side wall spacer to touch a side wall of the second section of second semiconductor material.

18. The method of claim 17 and further comprising:
etching the layer of insulation material to expose a third region of the top surface of the well that lies between the first and second non-conductive side wall spacers;
implanting the first section of second semiconductor material and the first region with a dopant of the second conductivity type so that the first section of second semiconductor material has the second conductivity type, and a region of the second conductivity type is formed in the well to extend down from the first region; and
implanting the second section of second semiconductor material and the third region with a dopant of the first conductivity type so that the second section of second semiconductor material has the first conductivity type, a region of the first conductivity type is formed in the well to extend down from the second region, and a region of the first conductivity type is formed in the well to extend down from the third region.

19. The method of claim 18 and further comprising forming a conductive material on the first section of second semiconductor material, the second section of second semiconductor material, and the third region, the conductive material having a conductivity that is less than a conductivity of the first section of second semiconductor material after the first section of second semiconductor material has been implanted.

20. The method of claim 16 and further comprising:
etching the layer of insulation material to expose a third region of the top surface of the well that lies between the first and second sections of second semiconductor material;
implanting the first section of second semiconductor material and the first region with a dopant of the second conductivity type so that the first section of second semiconductor material has the second conductivity type, and a region of the second conductivity type is formed in the well to extend down from the first region;
implanting the second section of second semiconductor material and the third region with a dopant of the first conductivity type so that the second section of second semiconductor material has the first conductivity type, a region of the first conductivity type is formed in the well to extend down from the second region, and a region of the first conductivity type is formed in the well to extend down from the third region; and
forming a conductive material on the first section of second semiconductor material, the second section of second semiconductor material, and the third region, the conductive material having a conductivity that is less than a conductivity of the first section of second semiconductor material after the first section of second semiconductor material has been implanted.

* * * * *

UNITED STATES PATENT AND TRADEMARK OFFICE
CERTIFICATE OF CORRECTION

| | |
|---|---|
| PATENT NO. | : 7,507,607 B1 |
| APPLICATION NO. | : 10/880284 |
| DATED | : March 24, 2009 |
| INVENTOR(S) | : Charles A. Dark et al. |

It is certified that error appears in the above-identified patent and that said Letters Patent is hereby corrected as shown below:

Column 1,
  Line 20, delete "Corner" and replace with --Comer--.

Column 6,
  Line 31, delete "comprising of doping" and replace with --comprising doping--.

Signed and Sealed this

Twenty-eighth Day of April, 2009

JOHN DOLL
*Acting Director of the United States Patent and Trademark Office*